United States Patent
Yun et al.

(10) Patent No.: US 8,351,070 B2
(45) Date of Patent: *Jan. 8, 2013

(54) IMAGE DATA PROCESSING METHOD AND RECORDING MEDIA FOR THE SAME

(75) Inventors: Kwansoo Yun, Suwon-si (KR); Prasad Jvv, Vasanth Nagar Bangalore Karnataka (IN); Jaewoo Joung, Suwon-si (KR); Shanghoon Seo, Seoul (KR); Sangdo Cho, Seongnam-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1003 days.

This patent is subject to a terminal disclaimer.

(21) Appl. No.: 12/318,961

(22) Filed: Jan. 13, 2009

(65) Prior Publication Data
US 2009/0310155 A1 Dec. 17, 2009

(30) Foreign Application Priority Data
Jun. 16, 2008 (KR) .................. 10-2008-0056566

(51) Int. Cl.
*G06F 15/00* (2006.01)
*H04N 1/60* (2006.01)
(52) U.S. Cl. ...................... 358/1.2; 358/1.12
(58) Field of Classification Search .............. 358/1.1, 358/1.2, 1.3, 1.5, 1, 9, 3.11, 3.12, 3.32, 1.12, 358/1.18; 347/9, 14, 19; 382/133, 145, 164
See application file for complete search history.

(56) References Cited

U.S. PATENT DOCUMENTS

| 7,314,269 | B2 * | 1/2008 | Kusunoki | 347/57 |
| 2003/0099394 | A1 * | 5/2003 | Shimazawa | 382/164 |
| 2008/0279441 | A1 * | 11/2008 | Matsuo et al. | 382/133 |

FOREIGN PATENT DOCUMENTS
JP 2007-176078 7/2007

OTHER PUBLICATIONS

Korean Office Action issued Nov. 27, 2009 in corresponding Korean Patent Application 10-2008-0056566.

* cited by examiner

*Primary Examiner* — Gabriel Garcia

(57) ABSTRACT

A method of obtaining image data for printing a circular pad having a radius R by forming ink blots having a radius r in an overlapping manner. The method can include: setting a base pitch as the base distance between adjacent ink blots, arranging the vector data of the pad in an x-y coordinate system, setting a first base point in the coordinate system, selecting a first determination point that is separated from the first base point by a unit distance along each of the x-axis and y-axis in any one direction of 45 degrees and 135 degrees, comparing the distance from the first base point to the first determination point with the base pitch, and storing the coordinates of the first determination point as print data if the distance from the first base point to the first determination point is greater than or equal to the base pitch.

26 Claims, 13 Drawing Sheets

IMAGE DATA PROCESSING METHOD AND RECORDING MEDIA FOR THE SAME

CROSS-REFERENCE TO RELATED APPLICATIONS

This application claims the benefit of Korean Patent Application No. 10-2008-0056566 filed with the Korean Intellectual Property Office on Jun. 16, 2008, the disclosure of which is incorporated herein by reference in its entirety.

BACKGROUND

1. Technical Field

The present invention relates to a method of processing image data and to a recorded medium tangibly embodying a set of instructions for implementing the method.

2. Description of the Related Art

Recently, inkjet printing technology is widely being used, not only in office applications, but also in industrial applications. One such example is the use of inkjet printing in processes for manufacturing a printed circuit board (PCB).

A printed circuit board may generally be designed using a layout software, where the design may include various shapes (for example, wide lines, circles, arcs, polygons, hollow circles, and interconnections). In printing these various shapes, an inkjet printer may eject ink droplets, which may form ink blots having a circular shape.

Since the inkjet printer may operate based on a raster image format, the various shapes may have to be filled with simulated ink blots, i.e. circles, and then saved as an image file format.

In order to ensure smoothness and avoid empty areas and thus provide the resolution and ink density required by the user, it is needed to carefully place the ink blots along the boundaries and in the interiors of the shapes that are to be printed.

SUMMARY

An aspect of the invention provides a method of processing image data and a recorded medium tangibly embodying a set of instructions for implementing the method, that can be utilized to print pads with a high level of surface smoothness and high reliability.

Another aspect of the invention provides a method of processing image data, as well as a recorded medium tangibly embodying a program of instructions for performing the method of processing image data, that may be used to obtain image data for printing a circular pad having a radius R by forming ink blots having a radius r in an overlapping manner. The method can include: setting a base pitch P as the base distance between adjacent ink blots, arranging the vector data of the pad in an x-y coordinate system, setting a first base point in the coordinate system, selecting a first determination point that is separated from the first base point by a unit distance along each of the x-axis and y-axis in any one direction of 45 degrees and 135 degrees (hereinafter referred to as a first direction), comparing the distance from the first base point to the first determination point with the base pitch P, and storing the coordinates of the first determination point as print data if the distance from the first base point to the first determination point is greater than or equal to the base pitch P.

The first base point can be at the center of the pad.

If the distance from the first base point to the first determination point is smaller than the base pitch P, the first determination point can be moved by a unit distance along each of the x-axis and y-axis in the first direction, after which the operation of comparing the distance from the first base point to the first determination point with the base pitch P can be repeated.

Also, after storing the coordinates of the first determination point as print data, the operations of selecting a second determination point separated from the first determination point by a unit distance along each of the x-axis and y-axis in the first direction, comparing the distance from the first determination point to the second determination point with the base pitch P, and storing the coordinates of the second determination point as print data if the distance from the first determination point to the second determination point is greater than or equal to the base pitch P can additionally be included.

Here, if the distance from the first determination point to the second determination point is smaller than the base pitch P, the second determination point can be moved by a unit distance along each of the x-axis and y-axis in the first direction, after which the operation of comparing the distance from the first determination point to the second determination point with the base pitch P can be repeated.

The method may further include setting a tolerance T, and comparing the distance from the first base point to the second determination point with the difference between the radius R of the pad and the tolerance T. In cases where the first base point is at the center of the pad, the tolerance T can be the sum of the radius r of the ink blots and the base pitch P.

The method may also include selecting a second base point separated from the first base point by a unit distance along each of the x-axis and y-axis in the other direction of 45 degrees and 135 degrees (hereinafter referred to as a second direction), comparing the distance from the first base point to the second base point with the base pitch P, and storing the coordinates of the second base point as print data if the distance from the first base point to the second base point is greater than or equal to the base pitch P.

Here, if the distance from the first base point to the second base point is smaller than the base pitch P, the second base point can be moved by a unit distance along each of the x-axis and y-axis in the second direction, and the comparing of the distance from the first base point to the second base point with the base pitch P can be repeated.

Also, after storing the coordinates of the second base point as print data, the operations of selecting a third determination point separated from the second determination point by a unit distance along each of the x-axis and y-axis in the first direction, comparing the distance from the second base point to the third determination point with the base pitch P, and storing the coordinates of the third determination point as print data if the distance from the second base point to the third determination point is greater than or equal to the base pitch P can additionally be included.

If the distance from the second base point to the third determination point is smaller than the base pitch P, the third determination point can be moved by a unit distance along each of the x-axis and y-axis in the first direction, and the operation of comparing the distance from the second base point to the third determination point with the base pitch P can be repeated.

The method may further include the operations of setting a tolerance T, and comparing the distance from the first base point to the second base point with the difference (R−T) between the radius R of the pad and the tolerance T, where the tolerance T can be the sum of the radius r of the ink blots and the base pitch P.

Additional aspects and advantages of the present invention will be set forth in part in the description which follows, and in part will be obvious from the description, or may be learned by practice of the invention.

DETAILED DESCRIPTION

Figure 1:
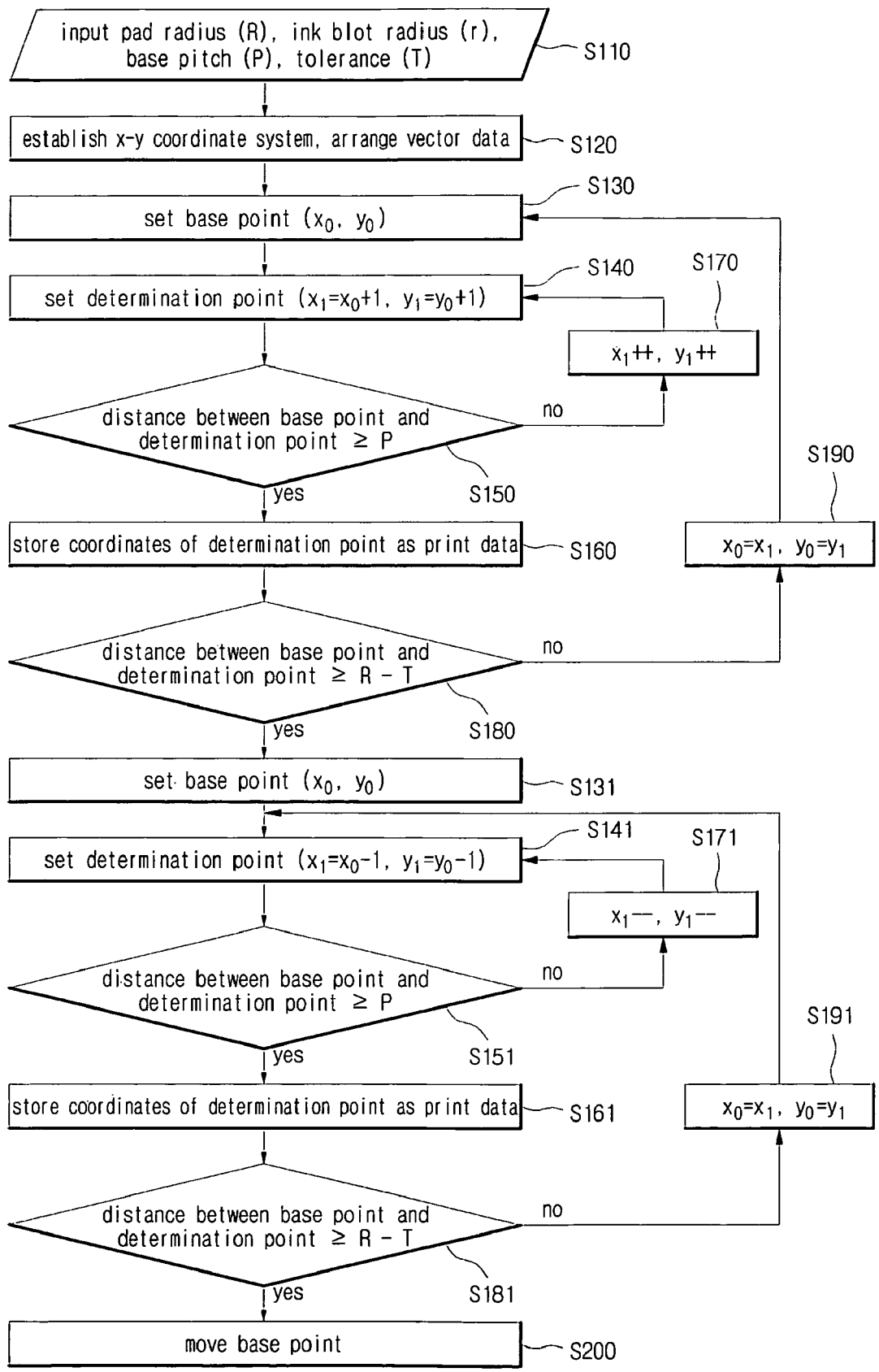
FIG. 1 and FIG. 2 are flowcharts illustrating a method of processing image data according to an embodiment of the invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first" and "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Certain embodiments of the invention will be described below in more detail with reference to the accompanying drawings. Those components that are the same or are in correspondence are rendered the same reference numeral regardless of the figure number, and redundant explanations are omitted.

Figure 2:
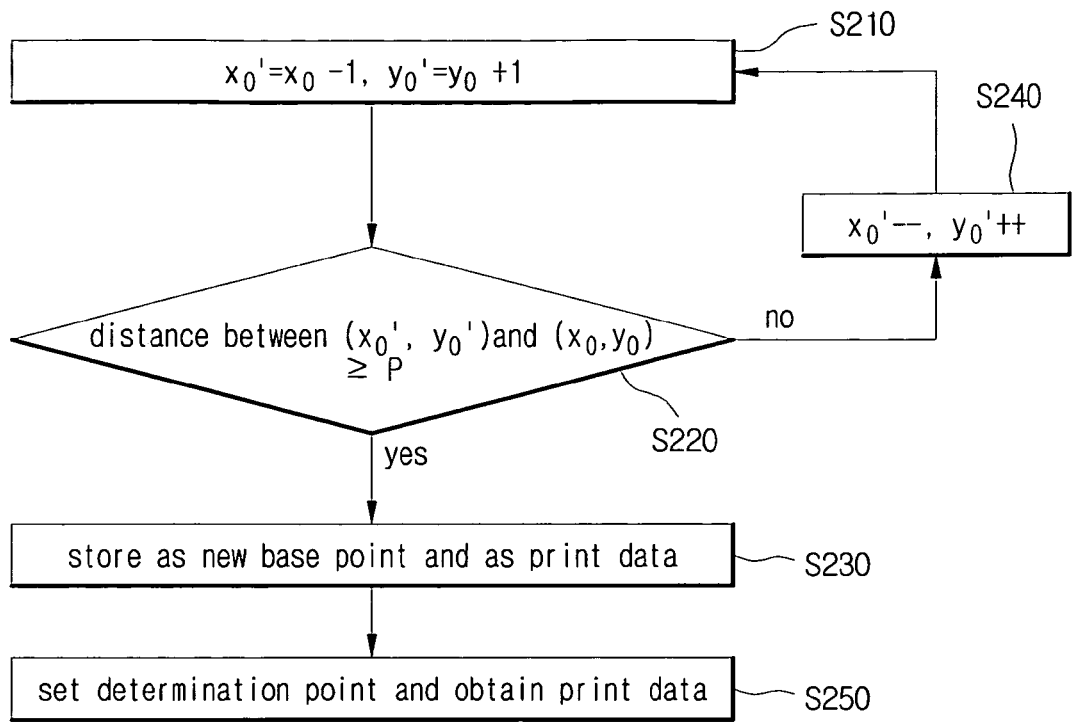
Figure 3:
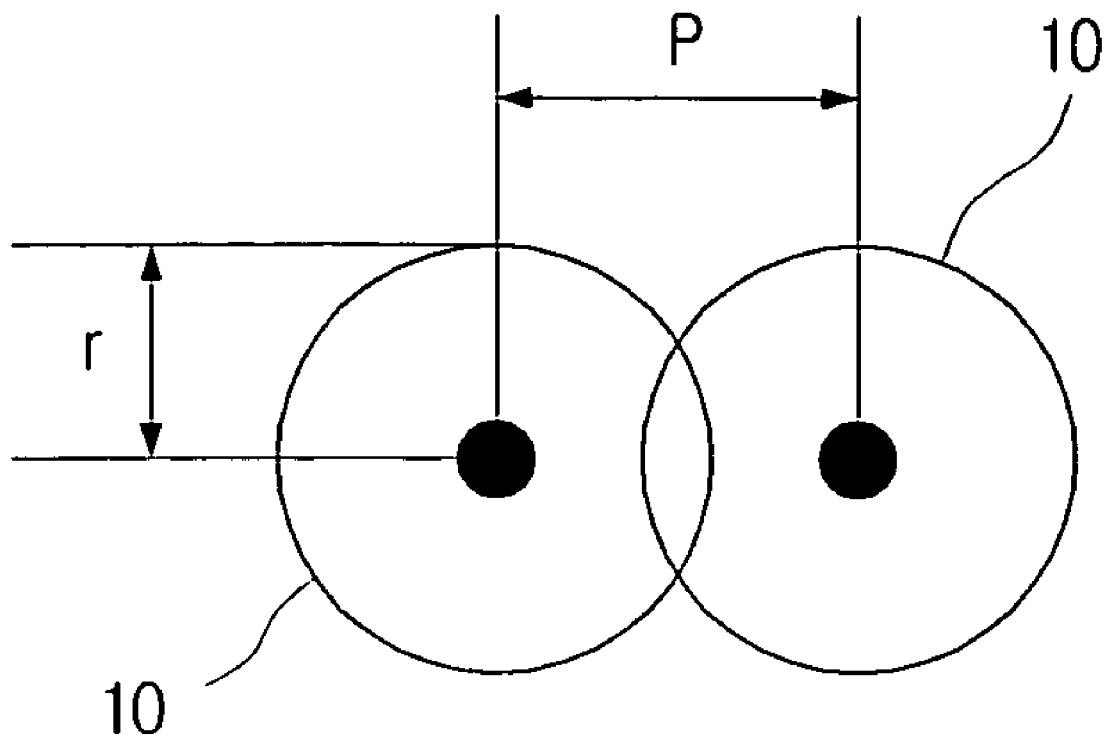
FIG. 3 is a plan view illustrating ink blots formed in an overlapping manner.

FIG. 1 and FIG. 2 are flowcharts illustrating a method of processing image data according to an embodiment of the invention, FIG. 3 is a plan view illustrating ink blots formed in an overlapping manner, and FIG. 4 through FIG. 13 are drawings representing a flow diagram for a method of processing image data according to an embodiment of the invention.

First, various settings can be configured and inputted (S110), such as the radius R of the pad to be printed, the radius r of the ejected ink blots, the base pitch P, which is a value representing the degree to which the ink blots overlap, and the tolerance T, etc.

As illustrated in FIG. 3, the radius of an ink blot 10 refers to the radius of the circular mark formed as the ink hits the substrate, etc., not the radius of the spherical ink droplet before it hits the substrate, etc.

The pitch refers to the distance between the center points of ink blots 10 that are formed in a partially overlapping manner, as illustrated in FIG. 3. The base pitch P refers to the base value of the pitch as intended by the designer.

Afterwards, as illustrated in FIG. 3, an x-y coordinate system can be established, and the vector data 20 of the pad, etc., to be printed can be arranged in the established coordinate system (S120). The x-y coordinate system can be established with various values for the unit distance, etc., according to the resolution (dpi) desired by the designer. Gerber data, etc., can be used for the vector data 20 of the pad, etc.

Then, a first base point 30 can be set (S130). In this particular embodiment, the center (0, 0) of the circular pad may be set as the first base point 30. Setting the center of the circular pad as the first base point, as in this embodiment, can make it easier to process image data by utilizing the symmetry of the layout. Of course, it is also possible to set various positions other than the center of the pad as the first base point.

After setting the first base point 30, a first determination point 31 can be selected that is separated from the first base point 30 by a unit distance along each of the x-axis and y-axis in one direction of 45 degrees and 135 degrees (hereinafter referred to as the first direction) (S140).

The first determination point 31 can be the point subject to the decision on whether or not it will be stored as print data, following the first base point 30. In this embodiment, the first determination point 31 may be selected from a point separated from the first base point 30 by a unit distance along each of the x-axis and y-axis in one direction of 45 degrees and 135 degrees (hereinafter referred to as the first direction), in order that the final image data obtained may be arranged in diagonal directions. To be more specific, in this particular embodiment, the point in the 45-degree direction, i.e. (1, 1) may be selected as the first determination point 31.

Afterwards, the distance $d_1$ from the first base point 30 to the first determination point 31 can be compared to the base pitch P (S150), and if the distance $d_1$ (in this embodiment, $\sqrt{2}$) from the first base point 30 to the first determination point 31 is greater than or equal to the base pitch P, the coordinates of the first determination point 31 can be stored as print data (S160).

However, if the distance from the first base point 30 to the first determination point 31 (in this embodiment, $\sqrt{2}$) is smaller than the base pitch, the first determination point can be moved by a unit distance in the 45-degree direction (S170), and the distance from the first base point 30 to the first determination point 31 can again be compared with the base pitch P (S150). In this embodiment, the comparison with the base pitch P may be repeated after moving the determination point to (2, 2).

After thus moving the first determination point, if the comparison shows that the distance from the first base point to the first determination point is greater than or equal to the base pitch, the coordinates of the moved first determination point can be stored as print data (S160).

In this way, the first determination point can be moved repeatedly until the distance from the first base point 30 to the first determination point is greater than or equal to the base pitch, to obtain the coordinates of the first determination point that are to be stored as print data.

After obtaining the coordinates of the first determination point that are to be stored as print data, the operations described above can be repeated with the first determination point 31 treated as the first base point 30.

In other words, a second determination point 32 can be selected at the point separated from the first determination point 31 by a unit distance along each of the x-axis and y-axis in the 45-degree direction, and the distance from the first determination point 31 to the second determination point 32 can be compared with the base pitch P.

If the result shows that the distance from the first determination point 31 to the second determination point 32 is greater than or equal to the base pitch P, the coordinates of the second determination point 32 can be stored as print data, and if the distance from the first determination point 31 to the second determination point 32 is smaller than the base pitch P, the second determination point 32 can be moved by a unit distance in the 45-degree direction (S170), and the distance from the first determination point 31 to the second determination point 32 can again be compared with the base pitch P (S150).

Figure 4:
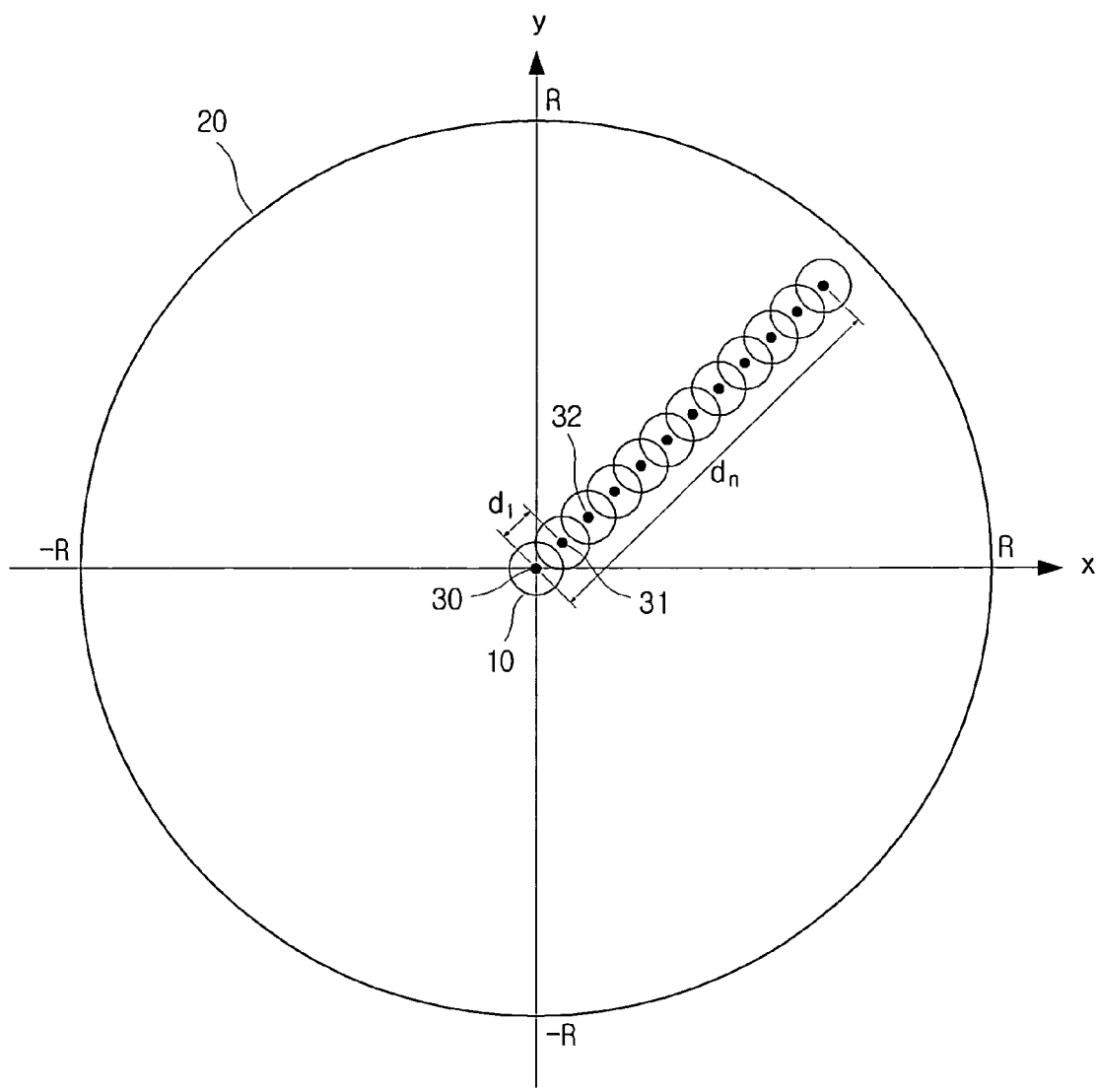
FIG. 4, FIG. 5, FIG. 6, FIG. 7, FIG. 8, FIG. 9, FIG. 10, FIG. 11, FIG. 12, and FIG. 13 are drawings representing a flow diagram for a method of processing image data according to an embodiment of the invention.
Figure 5:
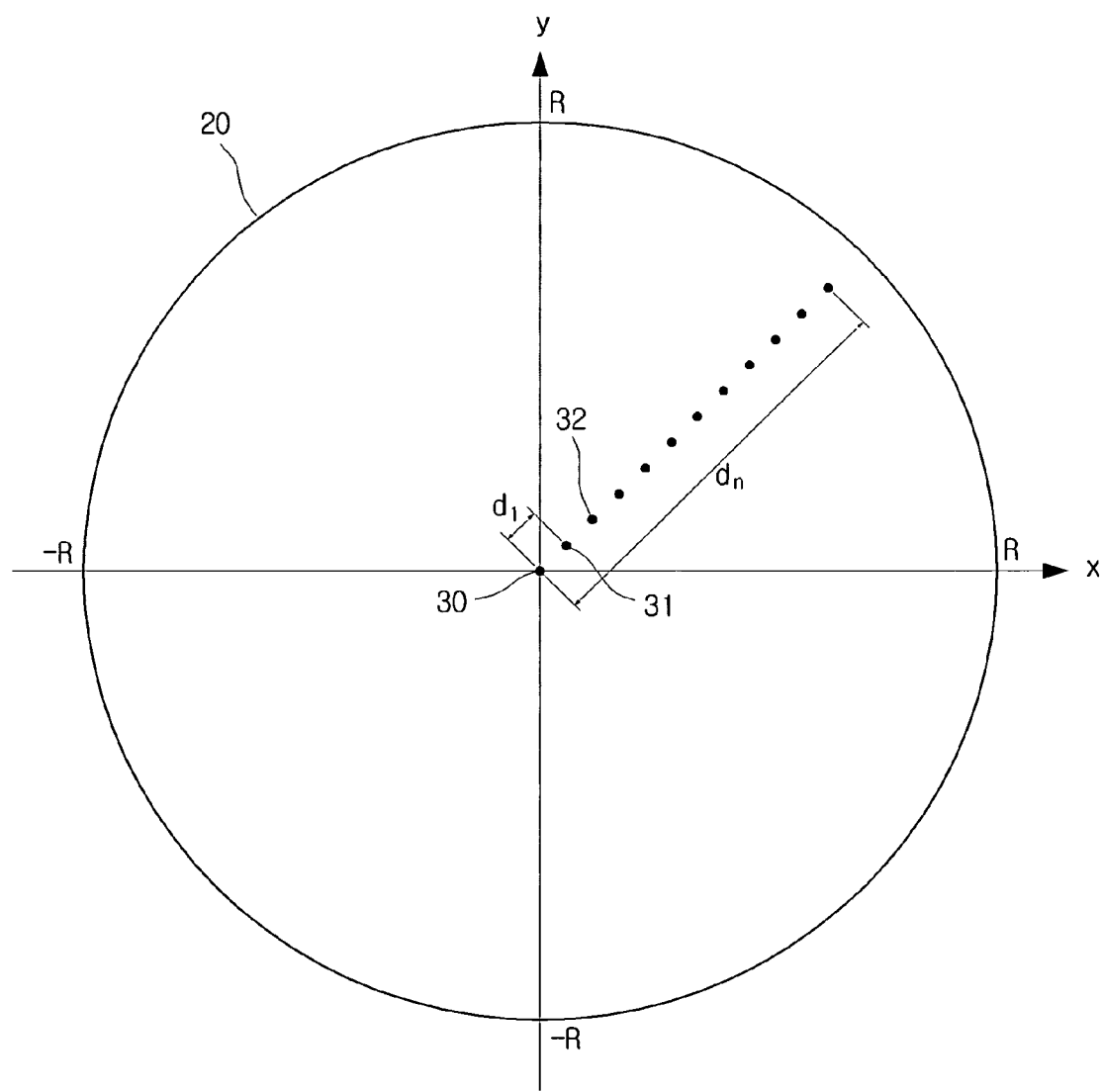

By repeating these operations an n number of times, print data can be obtained in a diagonal direction within a range that does not overstep the internal region of the pad. FIG. 4 illustrates an example after repeating the procedures n times, and FIG. 5 illustrates the diagonally-arranged print data that may be obtained after performing the above procedures.

In order that the print data may be obtained within a range that does not overstep the internal region of the pad, after obtaining the coordinates of each determination point stored as print data, an operation can be performed of comparing the distance from the first base point 30 to the relevant determination point with the difference between the radius of the pad and the tolerance, i.e. "R−T" (S180). If the comparison results show that the distance $d_n$ from the first base point to the relevant determination point is greater than or equal to R−T, the repetition can be stopped, and if it is smaller, the repetition can be continued.

The tolerance can be a value set by the designer in consideration of the size of the ink blots that allows the printed ink blots to be confined within the internal region of the pad. If the first base point is set at the center of the pad, as in this particular embodiment, the tolerance can be set as the sum of the radius r of the ink blot and the base pitch P, i.e. "r+P."

Figure 6:
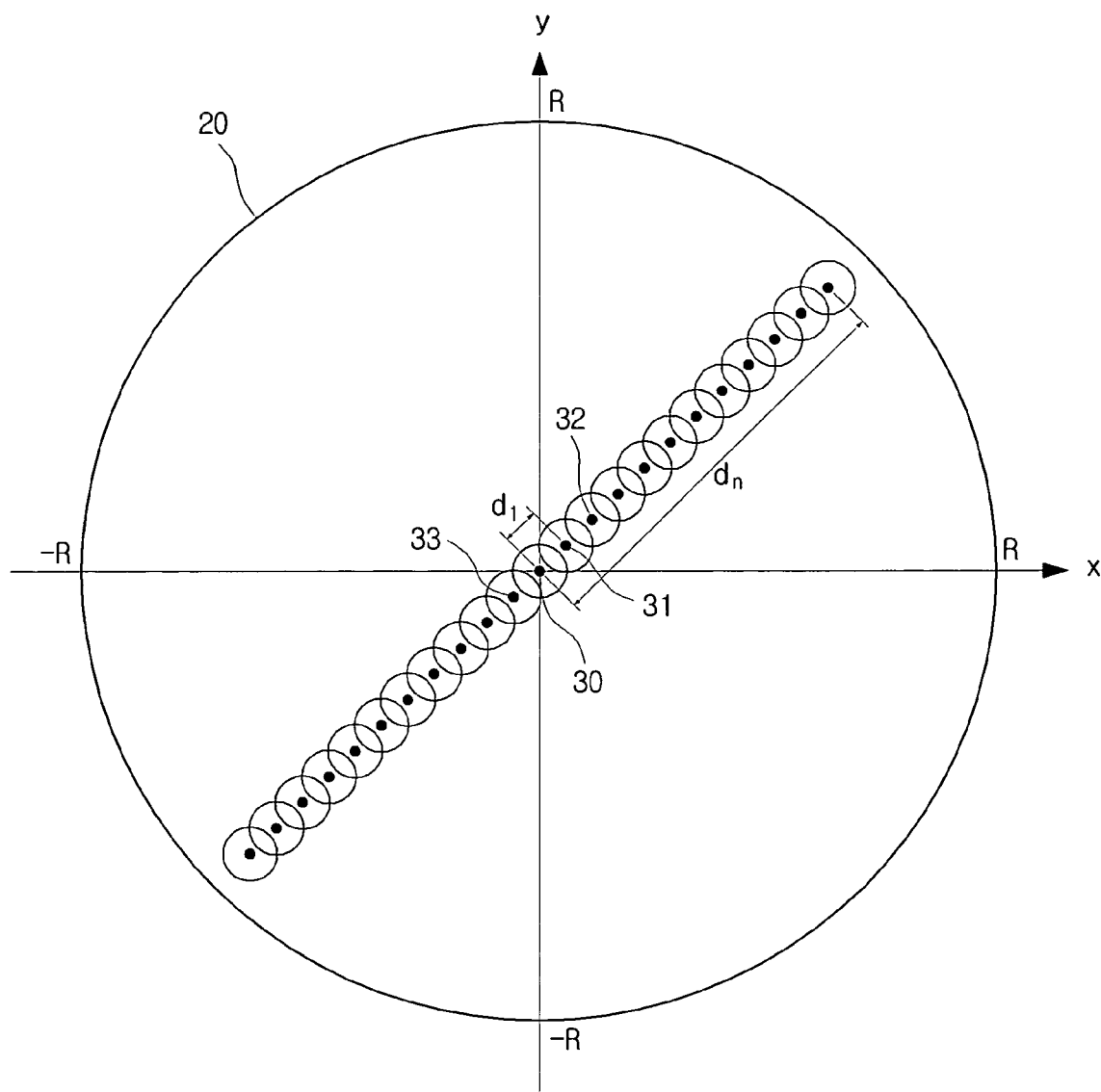
Figure 7:
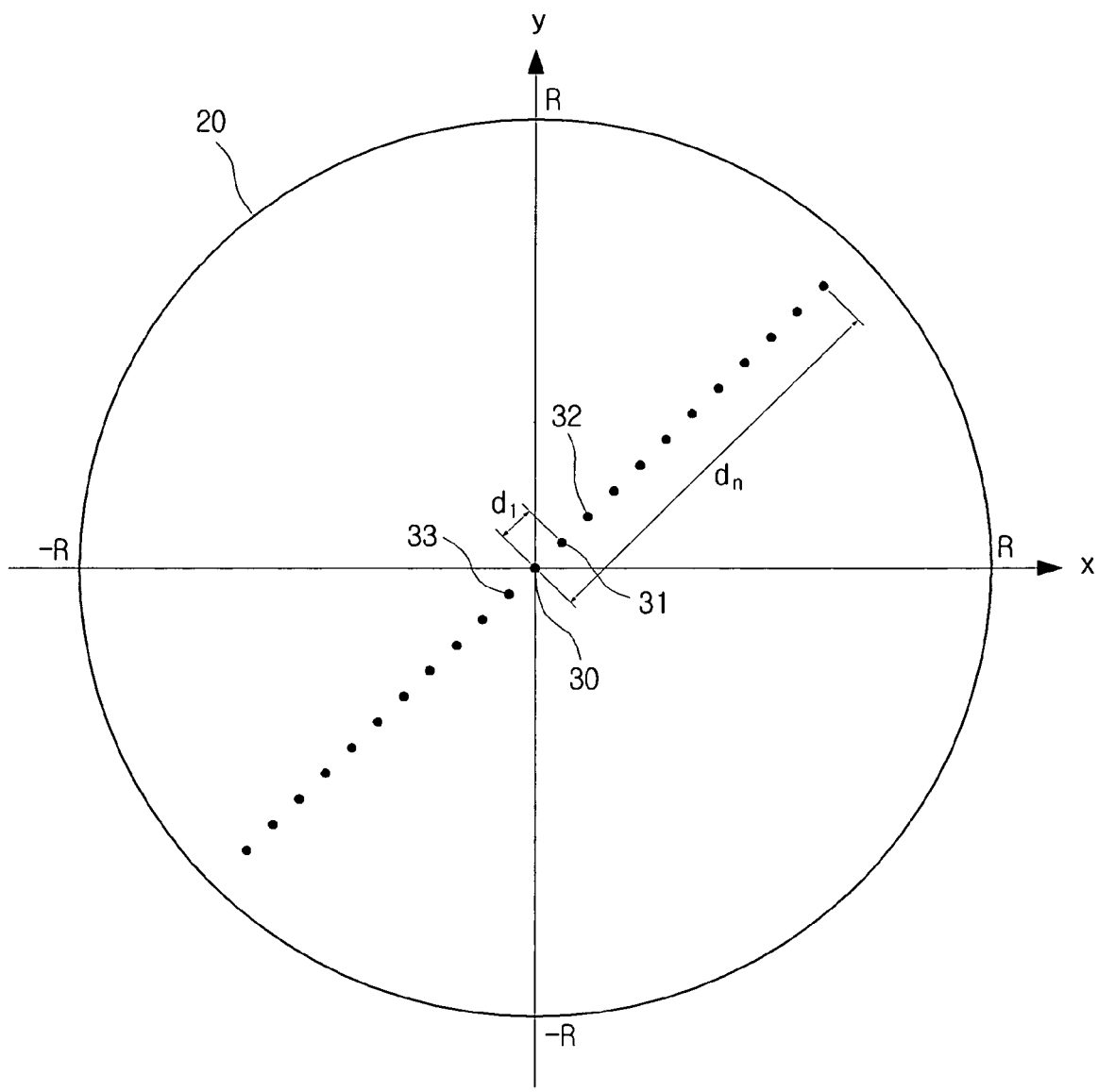
Figure 8:
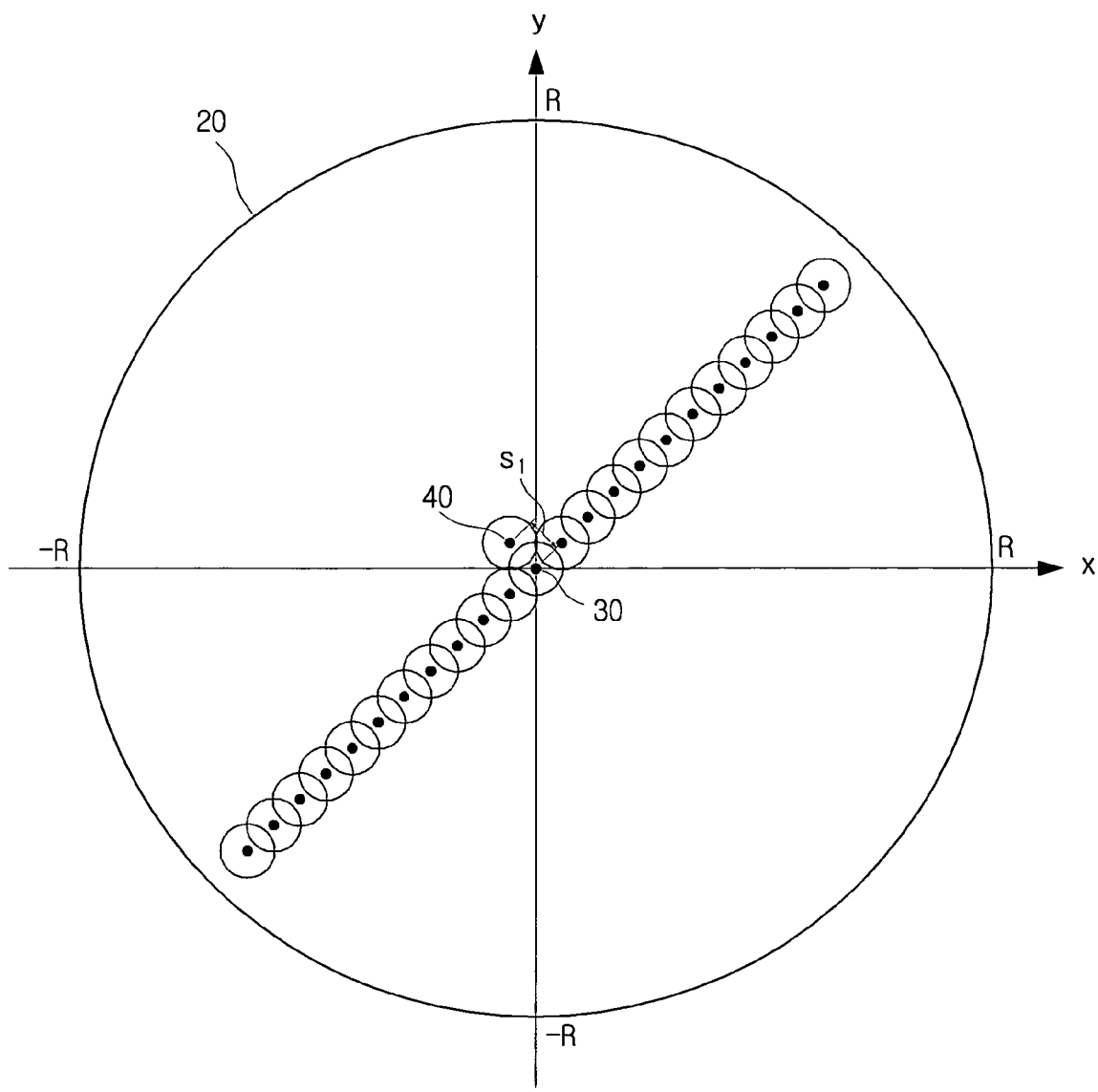
Figure 9:
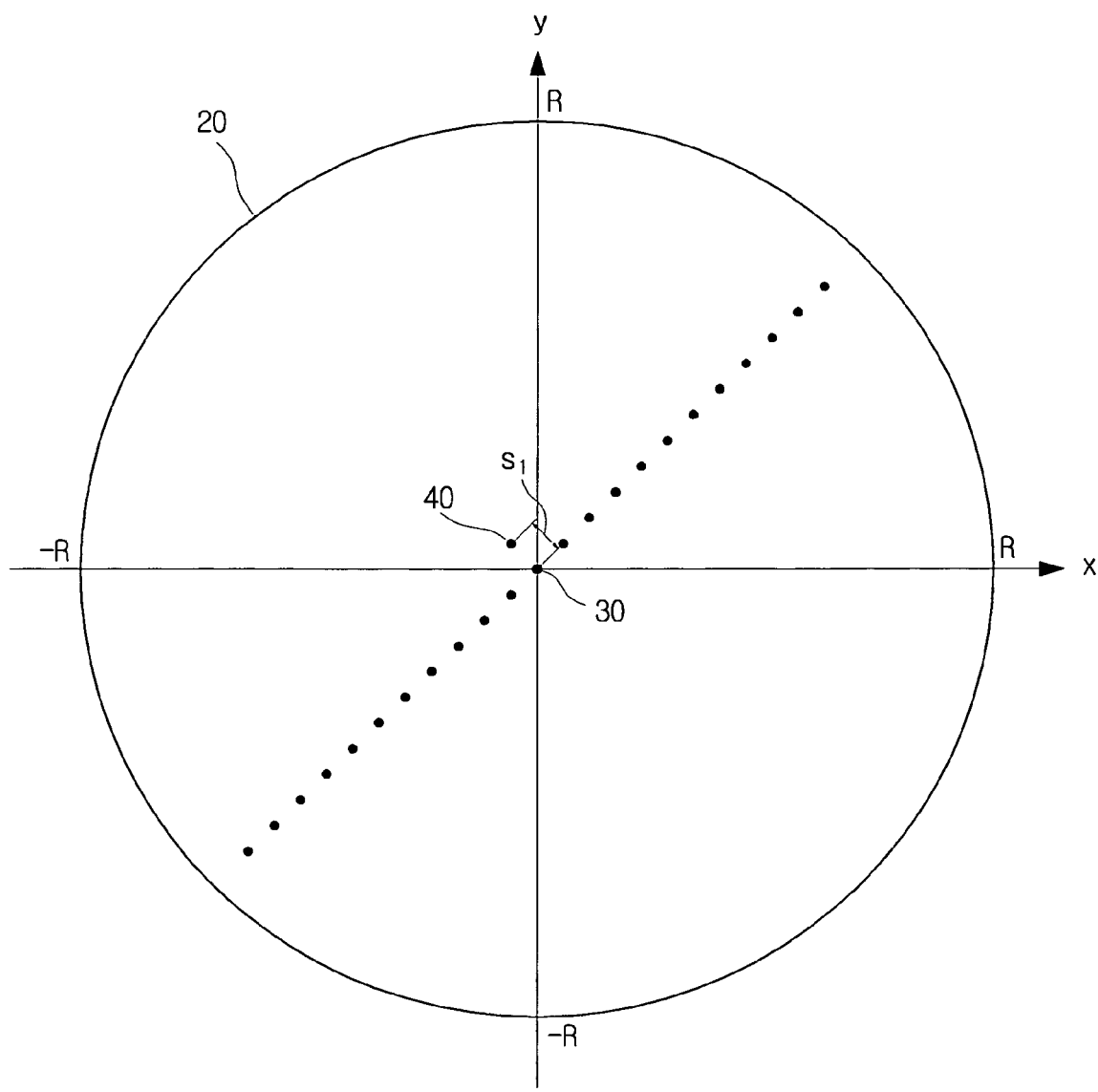

After obtaining print data as in this embodiment along the 45-degree direction from the base point at the center of the pad, the same principle may be used to obtain print data along the 225-degree direction, as illustrated in FIG. 6 and FIG. 7.

This can be achieved using a method of initializing the base point, followed by selecting the determination point 33 at a position separated from the base point 30 by a unit distance along each of the x-axis and y-axis in the 225-degree direction, and comparing the distance from the base point 30 to the determination point 33 with the base pitch P.

If the results show that the distance from the base point 30 to the determination point 33 is greater than or equal to the base pitch P, the coordinates of the point can be stored as print data, and if it is smaller than the base pitch P, the determination point 33 can again be moved by a unit distance along each of the x-axis and y-axis in the same direction, and the operation of comparing the distance can be repeated.

The operations indicated by numerals S141 to S191 in FIG. 1 are in corresponding relationships with the operations indicated by numerals S140 to S190, respectively, and as such can readily be understood from the descriptions for operations S140 to S190.

After obtaining the print data as described above in the 45-degree and 225-degree directions starting from the first base point 30, the base point can be moved to establish a new base point (S200), and the method described above for obtaining print data can be repeated. The method of moving the base point and selecting a new base point will be described as follows, with reference to FIG. 2 and FIG. 8.

First, a second base point 40 can be selected that is separated from the first base point 30 by a unit distance along each of the x-axis and y-axis in the other direction of 45 degrees and 135 degrees (hereinafter referred to as the second direction) (S210). As the 45-degree direction was selected above as the first direction, the second base point 40 may be selected as point (−1, 1), which is separated by a unit distance along each of the x-axis and y-axis in the 135-degree direction.

Afterwards, the distance $S_1$ from the first base point 30 to the second base point 40 can be compared with the base pitch P (S220), and if the distance $S_1$ (in this embodiment, $\sqrt{2}$) from the first base point 30 to the second base point 40 is greater than or equal to the base pitch P, the coordinates of the second base point 40 can be stored as the new base point and as print data (S230).

However, if the distance from the first base point 30 to the second base point 40 (in this embodiment, $\sqrt{2}$) is smaller than the base pitch, the second base point can be moved by a unit distance in the 135-degree direction (S240), and the distance from the first base point to the second base point can again be compared with the base pitch P (S210). In this embodiment, the comparison with the base pitch P may be performed again after moving the second base point to (−2, 2).

After thus moving the second base point, if the comparison shows that the distance from the first base point to the second base point is greater than or equal to the base pitch, the coordinates of the moved second base point can be set as the new base point, and the corresponding coordinates can be stored as print data (S230).

Figure 10:
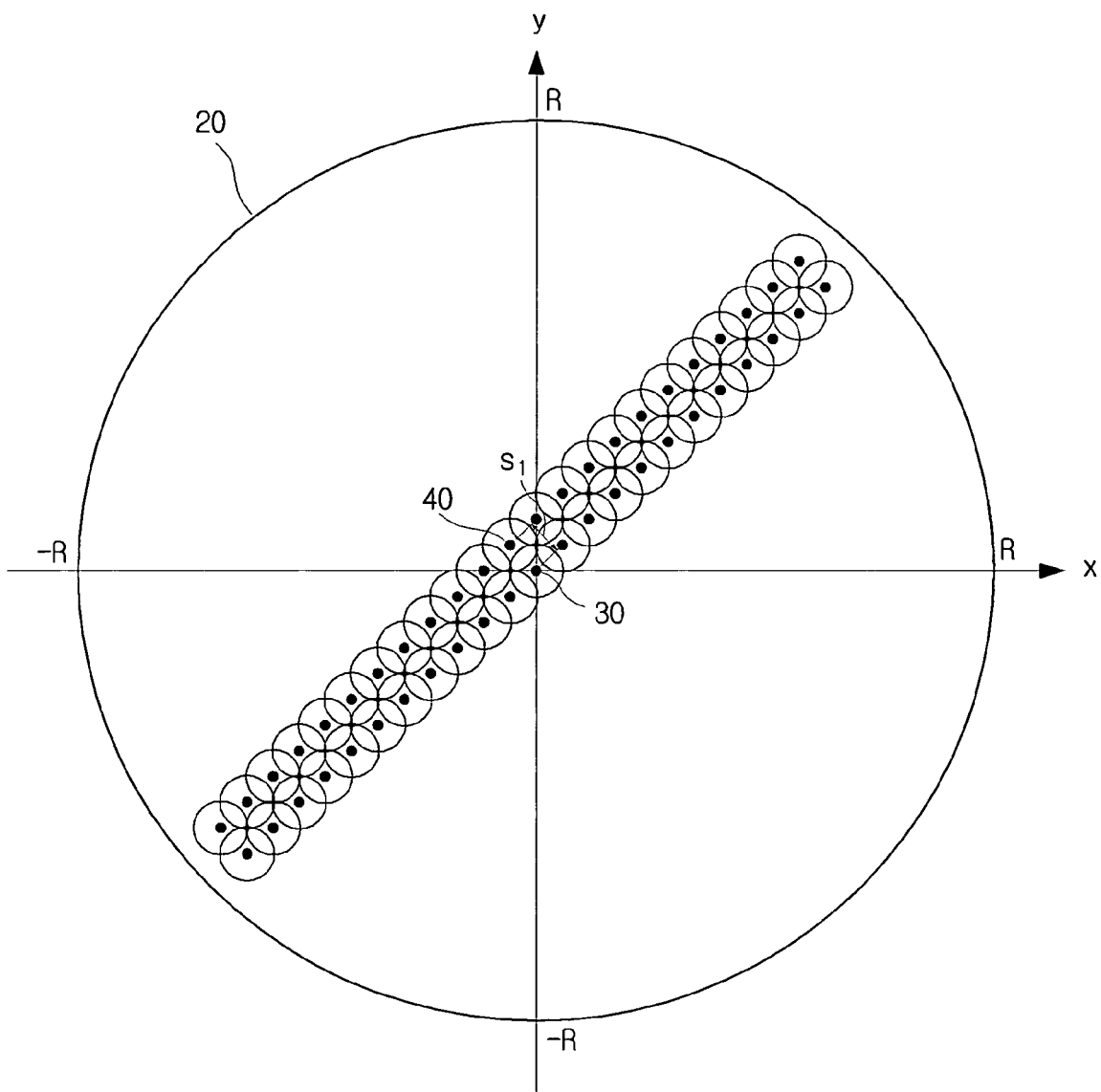
Figure 11:
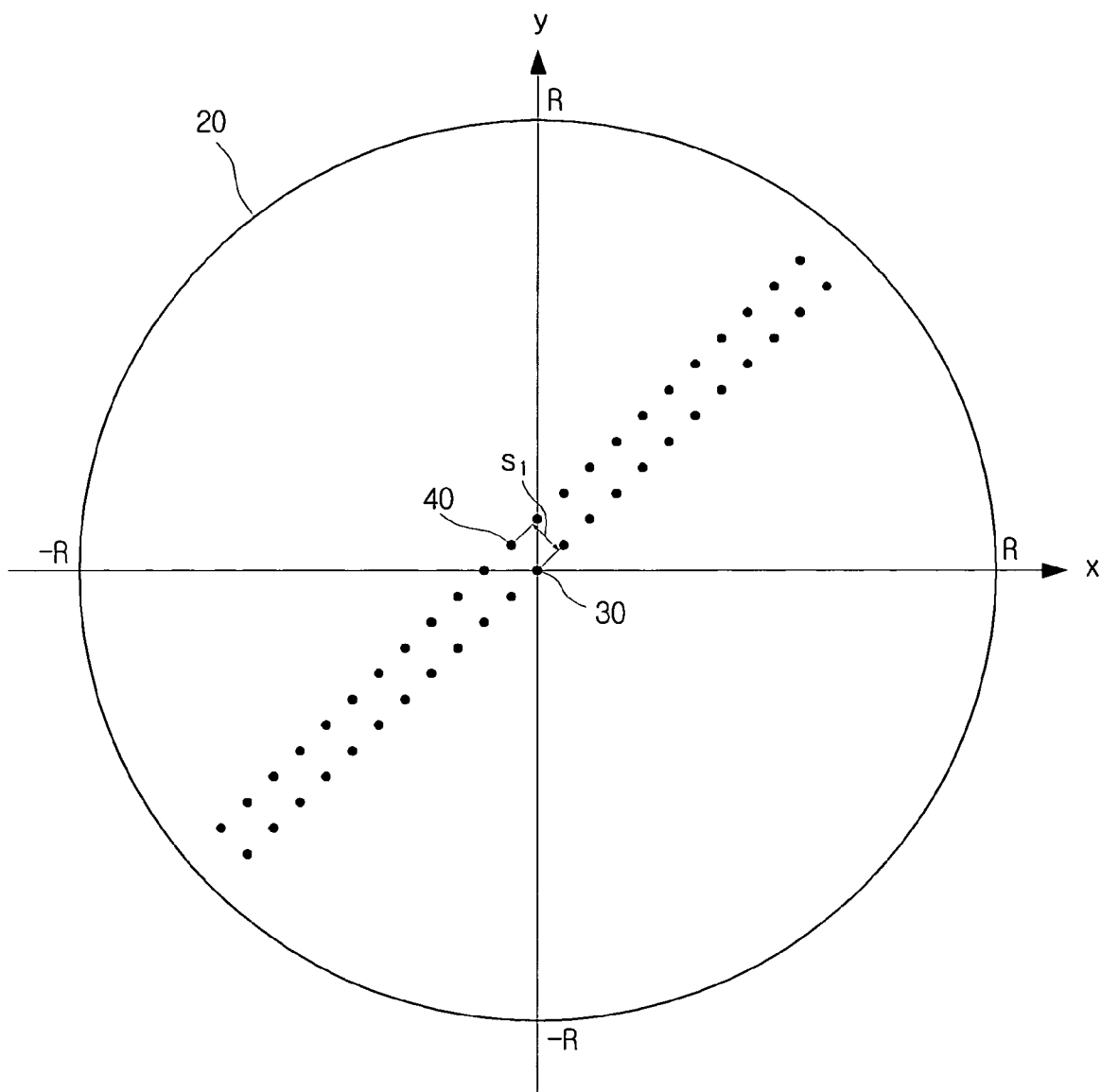

Afterwards, print data can be obtained in the 45-degree direction and the 225-degree direction starting from the newly set second base point 40, as illustrated in FIG. 10 and FIG. 11. This can be performed using substantially the same method as that used for obtaining print data starting from the first base point 30, and thus will not be described in further detail.

In order that the base point may be obtained within a range that does not overstep the internal region of the pad, after obtaining the coordinates of each base point stored as a new base point, an operation can be performed of comparing the distance from the first base point to the relevant base point with the difference between the radius of the pad and the tolerance, i.e. "R−T" (S181). If the comparison results show that the distance from the first base point to the relevant base point is greater than or equal to R−T, the moving of the base point can be stopped, and the procedures for obtaining print data can be performed starting from the base point in the 45-degree and 225-degree directions. The tolerance T may be the same as defined above.

Figure 12:
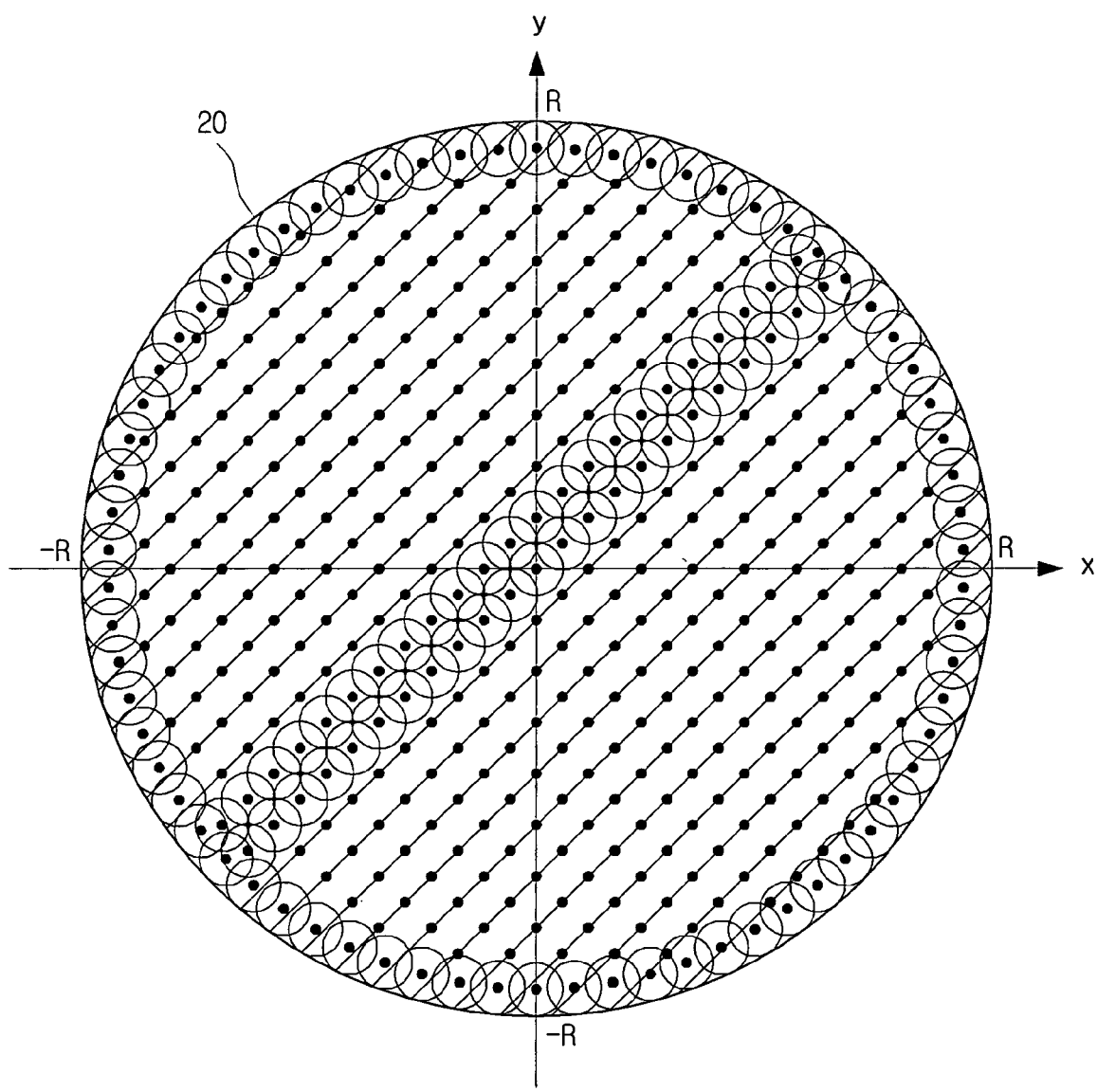
Figure 13:
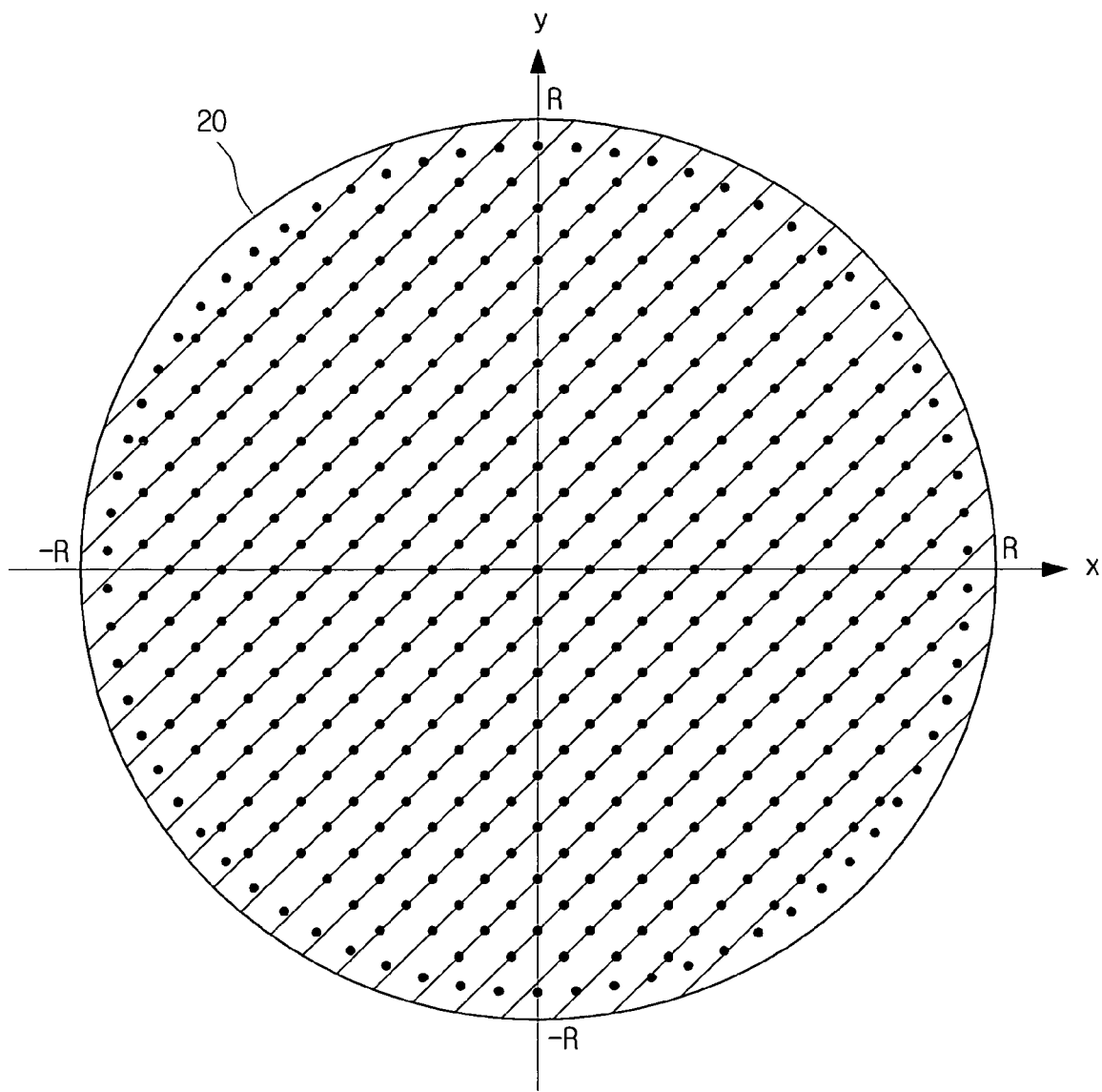

By repeatedly performing the operations described above, the image data for printing the inside portion of a circular pad 20 can be obtained, as illustrated in FIG. 12 and FIG. 13. In thus printing the pad 20, the perimeter portion of the pad 20 may be printed using a separate method before or after printing the inside portion.

This embodiment has been described for an example in which a method is used of obtaining print data in the 45-degree or 225-degree directions starting from a base point, and then moving the base point in the 135-degree and 315-degree directions. Of course, it is apparent that other similar methods may be used that employ different or reversed angle configurations.

Generalized and detailed aspects of the method of processing image data, as disclosed using the present embodiment, can be tangibly implemented as a recorded medium readable by a computer, etc., that stores a program of instructions executable by the computer, etc.

The procedures performed by the operations are substantially the same as or similar to the procedures set forth above, and thus will not be described here in further detail.

By utilizing certain embodiments of the invention as set forth above, a pad can be printed with a high level of surface smoothness and high reliability to satisfy the resolution and ink density requirements needed by the user.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

Many embodiments other than those set forth above can be found in the appended claims.

What is claimed is:

1. A method of processing image data to obtain image data for printing a circular pad having a radius R by forming ink blots having a radius r in an overlapping manner, the method comprising:
    setting a base pitch P as a base distance between adjacent ink blots;
    arranging vector data of the pad in an x-y coordinate system;
    setting a first base point in the coordinate system;
    selecting a first determination point, the first determination point separated from the first base point by a unit distance along each of the x-axis and y-axis in any one direction of 45 degrees and 135 degrees (hereinafter referred to as a first direction);
    comparing a distance from the first base point to the first determination point with the base pitch P; and
    storing coordinates of the first determination point as print data if the distance from the first base point to the first determination point is greater than or equal to the base pitch P.

2. The method of claim 1, wherein the first base point is at a center of the pad.

3. The method of claim 1, wherein the comparing of the distance from the first base point to the first determination point with the base pitch P is repeated, after moving the first determination point by a unit distance along each of the x-axis and y-axis in the first direction, if the distance from the first base point to the first determination point is smaller than the base pitch P.

4. The method of claim 1, further comprising, after the storing of the coordinates of the first determination point as print data:
    selecting a second determination point, the second determination point separated from the first determination point by a unit distance along each of the x-axis and y-axis in the first direction;
    comparing a distance from the first determination point to the second determination point with the base pitch P; and
    storing coordinates of the second determination point as print data if the distance from the first determination point to the second determination point is greater than or equal to the base pitch P.

5. The method of claim 4, wherein the comparing of the distance from the first determination point to the second determination point with the base pitch P is repeated, after moving the second determination point by a unit distance along each of the x-axis and y-axis in the first direction, if the distance from the first determination point to the second determination point is smaller than the base pitch P.

6. The method of claim 4, further comprising:
    setting a tolerance T; and
    comparing a distance from the first base point to the second determination point with a difference between the radius R of the pad and the tolerance T.

7. The method of claim 6, wherein the first base point is at a center of the pad, and
    the tolerance T is a sum of the radius r of the ink blots and the base pitch P.

8. The method of claim 1, further comprising:
    selecting a second base point, the second base point separated from the first base point by a unit distance along each of the x-axis and y-axis in the other direction of 45 degrees and 135 degrees (hereinafter referred to as a second direction);
    comparing a distance from the first base point to the second base point with the base pitch P; and
    storing coordinates of the second base point as print data if the distance from the first base point to the second base point is greater than or equal to the base pitch P.

9. The method of claim 8, wherein the comparing of the distance from the first base point to the second base point with the base pitch P is repeated, after moving the second base point by a unit distance along each of the x-axis and y-axis in the second direction, if the distance from the first base point to the second base point is smaller than the base pitch P.

10. The method of claim 8, further comprising, after the storing of the coordinates of the second base point as print data:
    selecting a third determination point, the third determination point separated from the second determination point by a unit distance along each of the x-axis and y-axis in the first direction;
    comparing a distance from the second base point to the third determination point with the base pitch P; and
    storing coordinates of the third determination point as print data if the distance from the second base point to the third determination point is greater than or equal to the base pitch P.

11. The method of claim 10, wherein the comparing of the distance from the second base point to the third determination point with the base pitch P is repeated, after moving the third determination point by a unit distance along each of the x-axis and y-axis in the first direction, if the distance from the second base point to the third determination point is smaller than the base pitch P.

12. The method of claim 8, further comprising:
    setting a tolerance T; and
    comparing a distance from the first base point to the second base point with a difference (R−T) between the radius R of the pad and the tolerance T.

13. The method of claim 12, wherein the tolerance T is a sum of the radius r of the ink blots and the base pitch P.

14. A recorded medium tangibly embodying a program of instructions for performing a method of processing image data to obtain image data for printing a circular pad having a radius R by forming ink blots having a radius r in an overlapping manner, the method comprising:
    setting a base pitch P as a base distance between adjacent ink blots;
    arranging vector data of the pad in an x-y coordinate system;
    setting a first base point in the coordinate system;
    selecting a first determination point, the first determination point separated from the first base point by a unit distance along each of the x-axis and y-axis in any one direction of 45 degrees and 135 degrees (hereinafter referred to as a first direction);

comparing a distance from the first base point to the first determination point with the base pitch P; and storing coordinates of the first determination point as print data if the distance from the first base point to the first determination point is greater than or equal to the base pitch P.

15. The recorded medium of claim 14, wherein the first base point is at a center of the pad.

16. The recorded medium of claim 14, wherein the comparing of the distance from the first base point to the first determination point with the base pitch P is repeated, after moving the first determination point by a unit distance along each of the x-axis and y-axis in the first direction, if the distance from the first base point to the first determination point is smaller than the base pitch P.

17. The recorded medium of claim 14, wherein the method further comprises, after the storing of the coordinates of the first determination point as print data:

selecting a second determination point, the second determination point separated from the first determination point by a unit distance along each of the x-axis and y-axis in the first direction;

comparing a distance from the first determination point to the second determination point with the base pitch P; and storing coordinates of the second determination point as print data if the distance from the first determination point to the second determination point is greater than or equal to the base pitch P.

18. The recorded medium of claim 17, wherein the comparing of the distance from the first determination point to the second determination point with the base pitch P is repeated, after moving the second determination point by a unit distance along each of the x-axis and y-axis in the first direction, if the distance from the first determination point to the second determination point is smaller than the base pitch P.

19. The recorded medium of claim 17, wherein the method further comprises:

setting a tolerance T; and comparing a distance from the first base point to the second determination point with a difference between the radius R of the pad and the tolerance T.

20. The recorded medium of claim 19, wherein the first base point is at a center of the pad, and the tolerance T is a sum of the radius r of the ink blots and the base pitch P.

21. The recorded medium of claim 14, wherein the method further comprises:

selecting a second base point, the second base point separated from the first base point by a unit distance along each of the x-axis and y-axis in the other direction of 45 degrees and 135 degrees (hereinafter referred to as a second direction);

comparing a distance from the first base point to the second base point with the base pitch P; and storing coordinates of the second base point as print data if the distance from the first base point to the second base point is greater than or equal to the base pitch P.

22. The recorded medium of claim 21, wherein the comparing of the distance from the first base point to the second base point with the base pitch P is repeated, after moving the second base point by a unit distance along each of the x-axis and y-axis in the second direction, if the distance from the first base point to the second base point is smaller than the base pitch P.

23. The recorded medium of claim 21, wherein the method further comprises, after the storing of the coordinates of the second base point as print data:

selecting a third determination point, the third determination point separated from the second determination point by a unit distance along each of the x-axis and y-axis in the first direction;

comparing a distance from the second base point to the third determination point with the base pitch P; and storing coordinates of the third determination point as print data if the distance from the second base point to the third determination point is greater than or equal to the base pitch P.

24. The recorded medium of claim 23, wherein the comparing of the distance from the second base point to the third determination point with the base pitch P is repeated, after moving the third determination point by a unit distance along each of the x-axis and y-axis in the first direction, if the distance from the second base point to the third determination point is smaller than the base pitch P.

25. The recorded medium of claim 21, wherein the method further comprises:

setting a tolerance T; and comparing a distance from the first base point to the second base point with a difference (R−T) between the radius R of the pad and the tolerance T.

26. The recorded medium of claim 25, wherein the tolerance T is a sum of the radius r of the ink blots and the base pitch P.

* * * * *